United States Patent [19]

Deyhimy et al.

[11] Patent Number: 5,204,559

[45] Date of Patent: Apr. 20, 1993

[54] METHOD AND APPARATUS FOR CONTROLLING CLOCK SKEW

[75] Inventors: Ira Deyhimy; Robert N. Deming; William C. Terrell, all of Thousand Oaks; David W. Hedges, Sunnyvale, all of Calif.

[73] Assignee: Vitesse Semiconductor Corporation, Camarillo, Calif.

[21] Appl. No.: 645,981

[22] Filed: Jan. 23, 1991

[51] Int. Cl.⁵ .................. H03K 19/00; H03K 5/13
[52] U.S. Cl. ............................... 307/480; 307/597; 307/269
[58] Field of Search ............... 307/262, 269, 597, 480, 307/526, 527, 202.1

[56] References Cited

U.S. PATENT DOCUMENTS

| | | | |
|---|---|---|---|
| 4,641,048 | 2/1987 | Pollock | 307/597 |
| 4,868,430 | 9/1989 | Stewart | 307/597 |
| 4,868,514 | 9/1989 | Azevedo et al. | 307/269 |
| 4,894,791 | 1/1990 | Jiang et al. | 307/597 |
| 4,922,141 | 5/1990 | Lofgren et al. | 307/577 |
| 5,041,738 | 8/1991 | Walters, Jr. | 307/269 |
| 5,043,596 | 8/1991 | Masuda et al. | 307/269 |

*Primary Examiner*—Edward P. Westin
*Assistant Examiner*—Andrew Sanders
*Attorney, Agent, or Firm*—Irell & Manella

[57] ABSTRACT

A circuit for controlling clock skew has a plurality of delay elements placed in each of the clock output paths in a clock distribution circuit. The delay elements may be selectively switched into or out of each clock output path in order to adjust the delays of each clock output path so that the skew between clock outputs is minimized. The delay in each clock output path is determined by measuring the frequency of a ring oscillator created by connecting a feedback loop across the delay elements. The frequency of oscillation is measured as delay elements are switched into or out of each clock output path until the frequency reaches close to a target frequency.

15 Claims, 11 Drawing Sheets

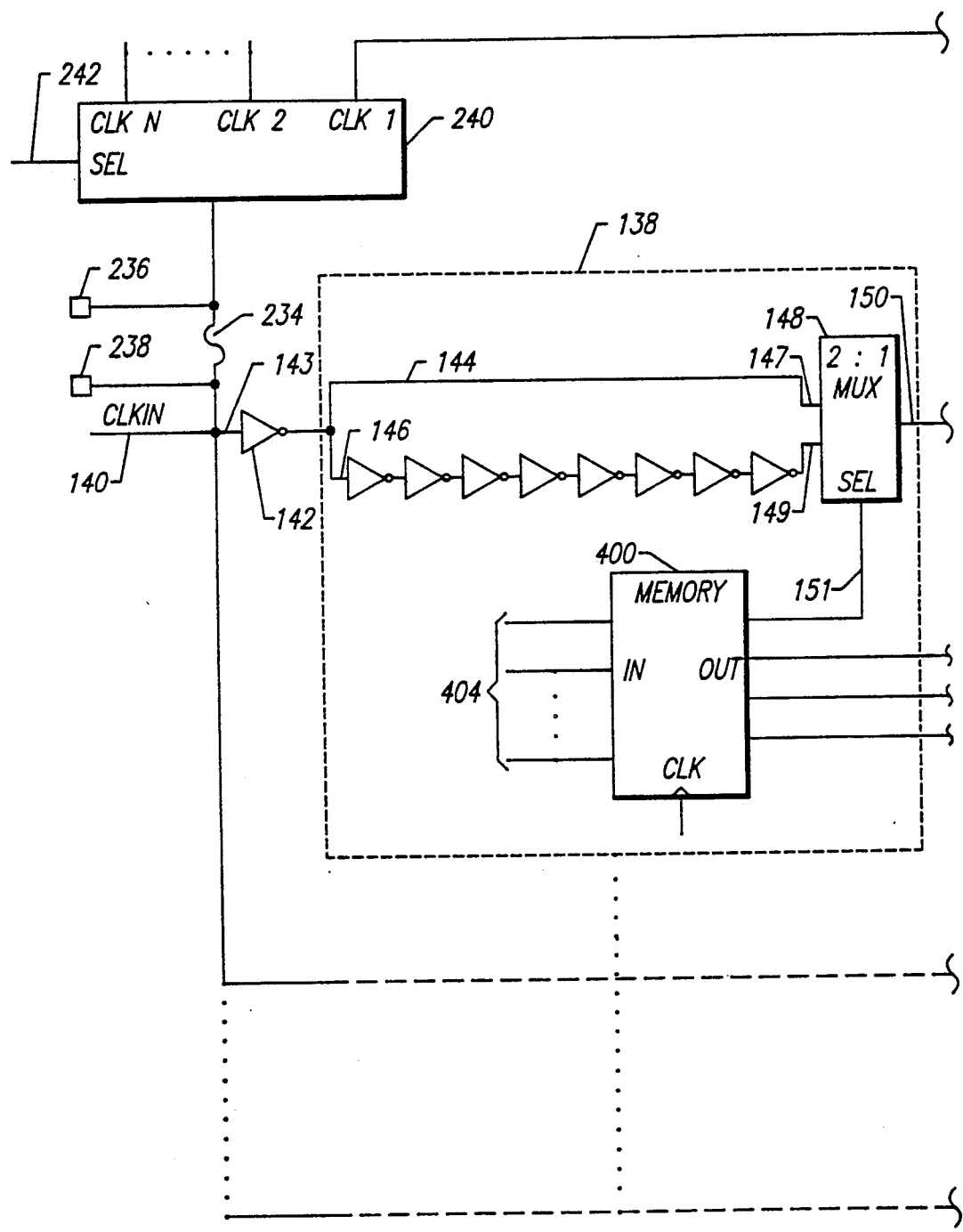
FIG. 9A(1)

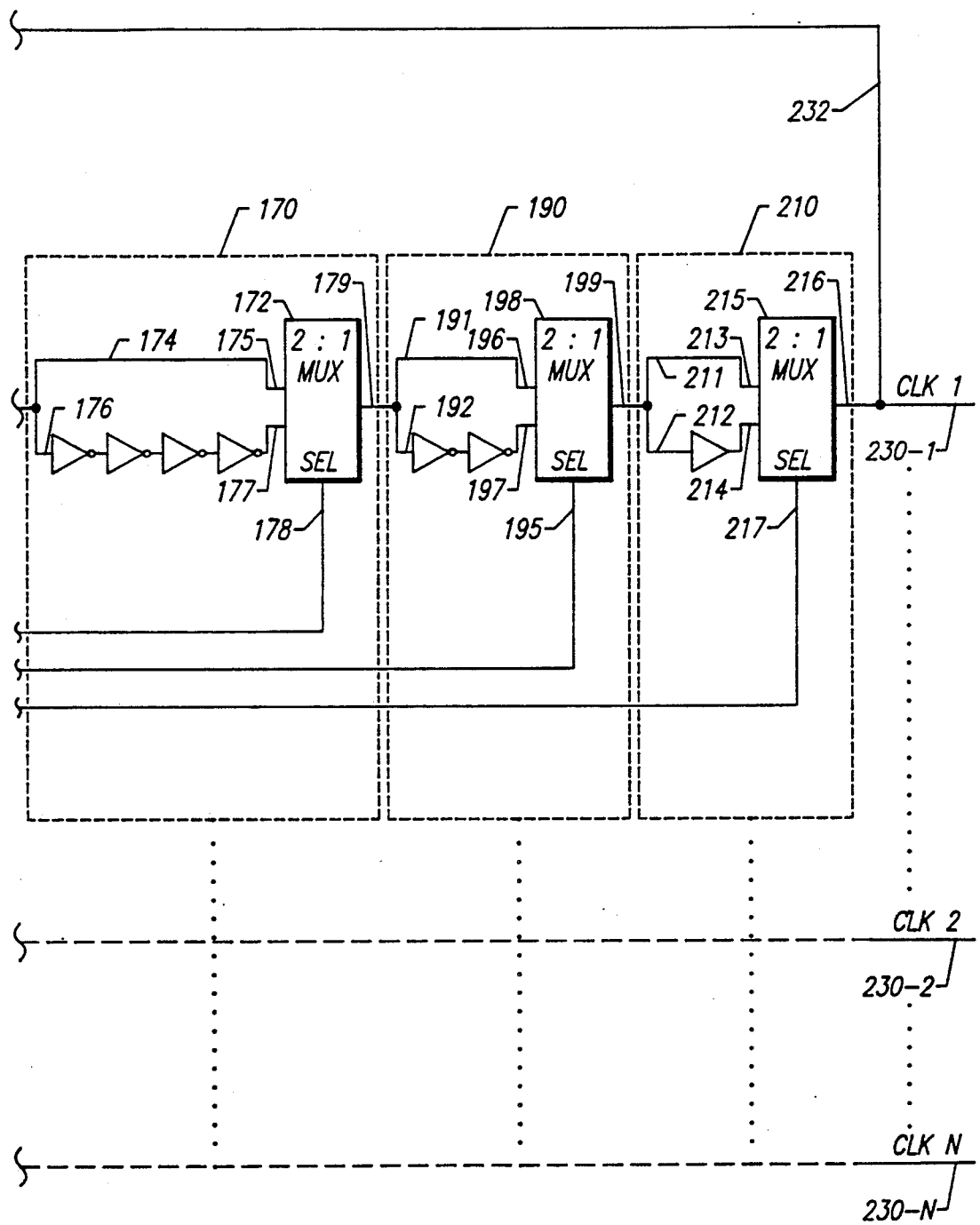
FIG. 9A(2)

METHOD AND APPARATUS FOR CONTROLLING CLOCK SKEW

FIELD OF THE INVENTION

The present invention relates to circuits which distribute a clock signal to several points in a computer system. More particularly, the present invention relates to a clock distribution circuit which allows for automatic adjustment of clock skew between outputs.

BACKGROUND OF THE INVENTION

Most digital circuits operate on a master clock signal. In particular, the components of a computer circuit (e.g., central processing unit, floating point unit, memory, etc.) perform their individual operations in accordance with a common master clock signal.

A master clock signal is typically derived from a primary clock signal. Although a primary clock signal can be generated by any oscillating signal, the primary clock signal is typically generated from a crystal oscillator because a crystal oscillator generates a signal having a very stable frequency. Most crystal oscillators, however, do not have a well-controlled duty cycle. For this reason, the crystal oscillator is usually chosen to have a frequency twice that of the desired master clock signal frequency. The crystal oscillator signal is then fed into a divide-by-two circuit and then into a plurality of output buffers which output a plurality of master clock signals. Each master clock signal has a frequency one-half that of the crystal oscillator signal input frequency and has a controlled output duty cycle.

A typical clock distribution circuit 102 is shown in FIG. 1. A primary clock signal 101 is produced by a crystal oscillator 103. The clock distribution circuit 102 generates a master clock signal on each of N clock output lines 104. The clock distribution circuit 102 includes a divide-by-two circuit 105 and N buffer amplifiers 106. Each of the N clock output lines 104 carries a master clock signal to one or more of the components of computer circuitry, not shown.

For the computer system to work properly, clock pulses of the master clock signal must arrive simultaneously at each of the computer system components. In practice, however, there is always a small difference between the time a clock pulse arrives at one component and the time the same clock pulse arrives at another component within the computer system. This difference is called "clock skew." Computer systems generally have a certain tolerance to skew which diminishes as the clock frequency increases (as the time between clock transitions decreases).

Clock skew is a well-known difficulty occurring in clock distribution circuits. Clock skew is mostly caused by variation in integrated circuit process parameters which vary transistor switching times from transistor to transistor. Layout parasitics and packaging effects also contribute to clock skew.

Clock skew can be graphically illustrated by the timing diagram shown in FIG. 2. The graphed signals shown in FIG. 2 correspond to the circuit shown in FIG. 1. The primary clock signal 101 in FIG. 2 is an exemplary rising crystal oscillator signal provided to the input of the clock distribution circuit 102. The primary clock signal 101 has a transition 110 (e.g., a rising clock signal). Signals CLK 1, CLK 2, and CLK N all represent exemplary master clock signals on the corresponding outputs 104 of the clock distribution circuit 102 shown in FIG. 1. Of all of the master clock outputs, the first transition following the transition 110 in the primary clock signal 101 is a transition 112-1 in the master clock output signal CLK 1 (104-1). A transition 112-N in the signal CLK N (104-N), occurs after the transition 112-1 in the signal CLK 1 (104-1). A transition 112-2 in the signal CLK 2 (104-2) is the last transition of all of the clock output signals 104 to occur following the transition 110 in the primary clock signal 101. Thus, the time lapse between the transition 110 in the primary clock signal 101 and the transition 112-2 in the master clock signal CLK 2 is shown as a maximum time delay 115. Similarly, the time lapse between the transition 110 in the primary clock signal 101 and the transition 112-1 in the signal CLK 1 (104-1) is shown as a minimum time delay 113 among all of the clock outputs shown in FIG. 2. The transition 112-N in the master clock output signal CLK N (104-N) occurs between the transition 112-1 and the transition 112-2. The time delay between the transitions 112-1 and 112-2 in the master clock output signals 104 is called the clock skew 118.

A method for eliminating the skew between clock outputs is illustrated in FIG. 3. Variable delay elements 120 and 122 are added to the clock distribution circuit 102. After the components of the computer system have been assembled onto a printed-circuit board (PC board), the delay elements 120 and 122 are adjusted to add delay so that the skew between the master clock outputs 104 is nearly eliminated. Variable delay element 120, connected between the divide-by-two circuit 105 and the clock signal outputs, adds delay to all of the clock outputs. Variable delay elements 122 separately add delay to each of the master clock outputs 104.

This conventional adjustment procedure is very time consuming and is also prone to inaccuracy. Additionally, this method can consume significant area on the PC Board and it can consume substantial power. These and other factors contribute to increase the cost and inefficiency of utilizing such a procedure.

SUMMARY OF THE INVENTION

The present invention is a method and apparatus for reducing or eliminating the deficiencies of prior art techniques for adjusting clock skew in a clock distribution circuit. Briefly, the circuit of the present invention advantageously has a series of programmable delay blocks connected to each clock output. The programmable delay blocks include any circuit element means which produces a delay. In the preferred embodiment of the present invention, the delay elements are inverters.

Each programmable delay block is connected to a switching means which is used to selectively switch the delay elements within the programmable delay block into or out of a master clock output path in order to add or subtract a desired amount of delay to or from the master clock output path. In one embodiment of the present invention, fuses are used as the switching means.

In the preferred embodiment of the present invention, the delay elements are grouped into the programmable delay blocks to provide delays that are powers of two (1, 2, 4, 8, 16, etc.) times the smallest unit delay. Such grouping allows the delay elements to be switched into or out of the master clock output path in binary-weighted groups, thereby minimizing the required number of switching means necessary to obtain any desired delay. The skew between each of the master clock signals can be measured and the switching means can be employed to reduce the skew to a minimum, less than one unit delay.

In the preferred embodiment, a feedback loop is connected between the input and output of each master clock output path. Each feedback loop contains a switching means (e.g., a fuse) which is later used to disconnect the feedback path. Each master clock output path contains an odd number of inverters so as to form a ring oscillator with the feedback loop. The ring oscillator is used to measure the delay of each clock output path by measuring its frequency of oscillation. This technique yields a more accurate method of measuring delay.

Each ring oscillator oscillates at a frequency of $1/(2t_d)$, where $t_d$ is the delay through a particular output path. A chip tester or frequency counter measures the frequency and feeds the results to a controller. The controller calculates how far this frequency is from the target frequency which corresponds to the target delay. By use of a lookup table, the controller determines which fuse to blow (i.e., open) in order to bring the delay within a predetermined range of, but not less than, the target delay. The frequency is measured again, and the next fuse to be blown is determined. This procedure is continued until the remaining frequency discrepancy from the target frequency is less than the delay difference corresponding to the minimum programmable increment of delay (the predetermined range).

Lastly, a fuse which connects the feedback path and forms the ring oscillator is blown, thus eliminating the oscillation. This procedure for setting the delay in one clock output path is repeated for each of the other clock output paths.

In an alternative embodiment of the present invention, the effect of a blown fuse is emulated before it is actually blown. In this way, a pattern of blown fuses can be simulated before the fuses are permanently blown. If too little delay is ever measured, the blown fuse pattern is rechosen in order to reduce the delay. Only after a desired blown fuse pattern has been determined are the fuses then permanently blown.

In alternative embodiments, the switching means may comprise other switching means, such as ROMs, RAMs, EPROMs, EEPROMs, shift registers, latches, or the like.

The method and apparatus of the present invention can be applied to the clock distribution network of an entire computer system on a monolithic semiconductor chip, on a hybrid chip package, or on a PC board. Each of the clock output paths has a feedback path connected from the destination of the clock signal, the computer system component receiving the clock signal, and back to the clock distribution circuit, in the same way as the feedback path for the present invention in a single clock distribution chip. A tester is then used to measure the frequency of the ring oscillation caused by the feedback loop. By a method similar to the method disclosed above, the tester controls the switching means and remeasures the frequency until the frequency reaches within a predetermined range of the target frequency. Then, the feedback loops are disconnected by blowing fuses in the feedback path or, alternatively, by physically removing the feedback loops.

The subject of this disclosure is not limited to any particular logic family or substrate. The embodiments of the present invention are described without being so limited. The present invention has applicability to all possible implementations, including, without limitation, GaAs, CMOS, TTL, ECL, and the like. However, some of the problems addressed by the present invention are most critical in GaAs applications because of higher operating speeds.

BRIEF DESCRIPTION OF THE DRAWINGS

FIG. 9a1 and 9a2 illustrates a memory circuit which is incorporated into the alternative embodiments of the present invention as shown in FIGS. 4, 6 and 7.

DETAILED DESCRIPTION OF THE PREFERRED EMBODIMENT

Figure 4A:
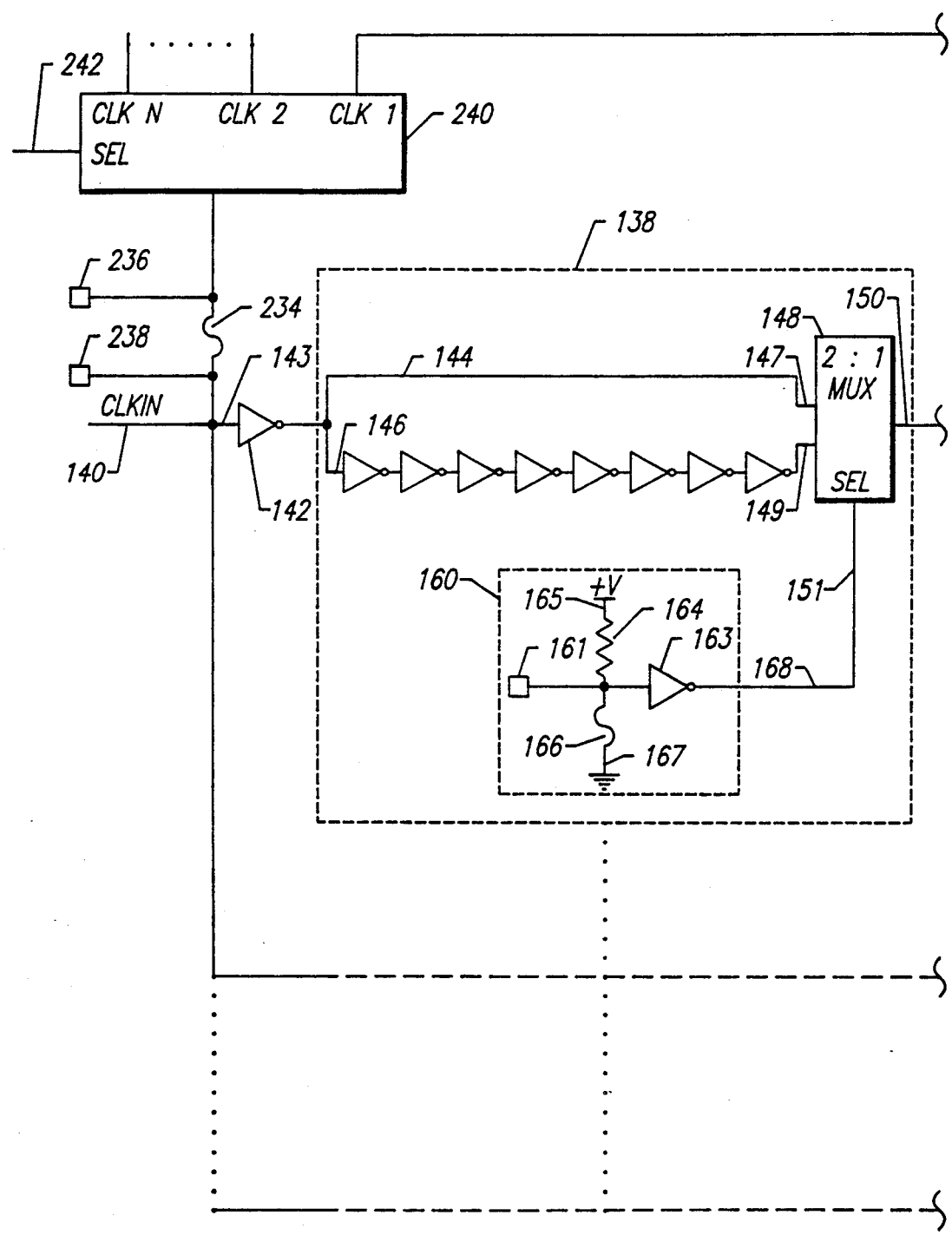
FIG. 4a and 4b illustrate a clock distribution circuit constructed in accordance with one embodiment of the present invention.
Figure 4B:
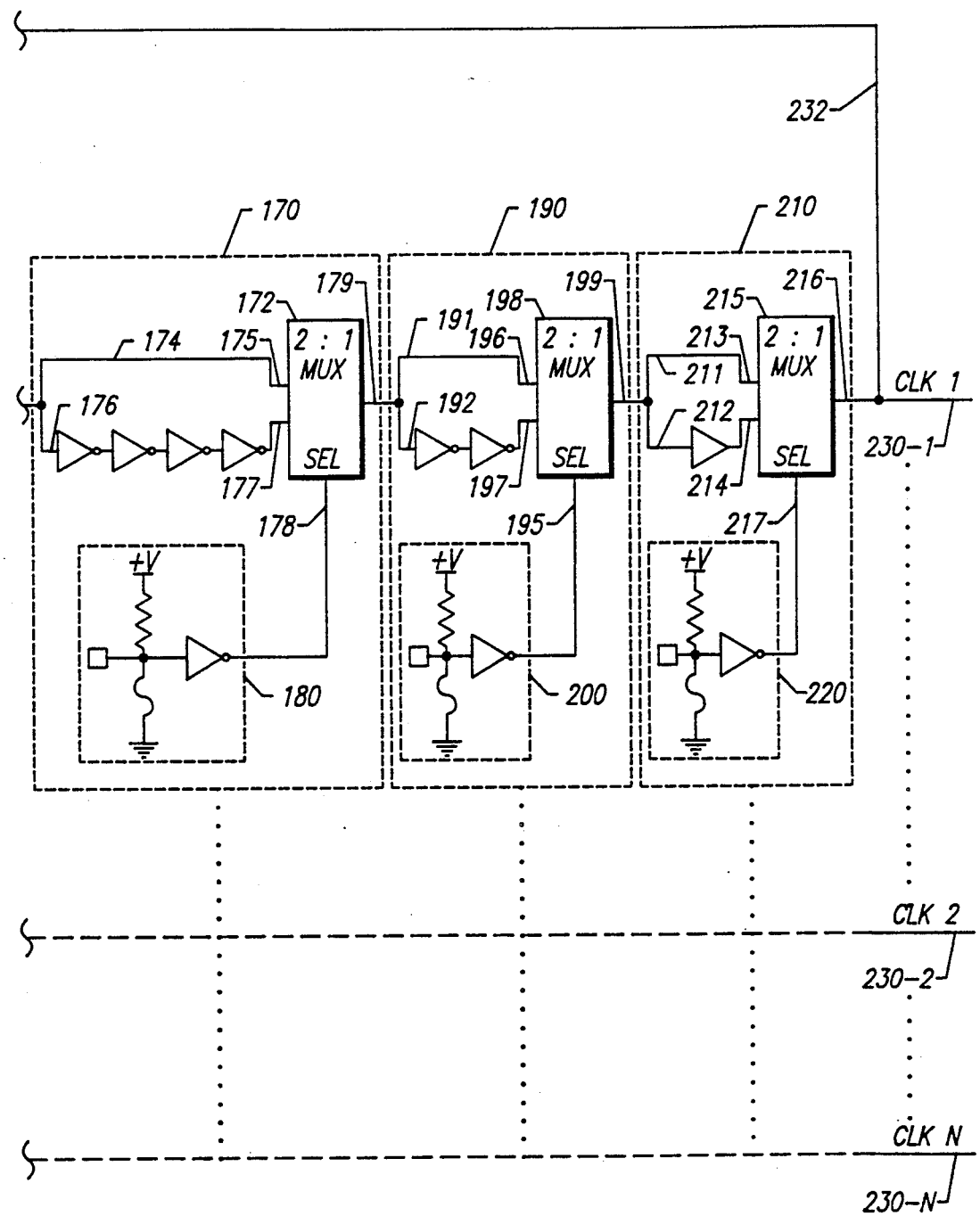

One embodiment of a clock distribution circuit constructed in accordance with the present invention is illustrated in FIG. 4. Referring now to FIG. 4, the master clock signal to be distributed to several master clock output lines is provided to the circuit on line 140. The input master clock signal is transferred from line 140 to an inverter 142 in master clock output path CLK 1 via a line 143.

The output from the inverter 142 is provided to a first programmable delay block 138. The first programmable delay block 138 splits the output of the inverter 142 onto two lines, an undelayed line 144 and a delayed line 146. Undelayed line 144 is connected directly to an input 147 of a first multiplexer 148. The first multiplexer 148 is a 2:1 multiplexer. Delayed line 146 contains eight inverters and is connected to a second input 149 of the first multiplexer 148. The inverters in the delayed line 146 add a delay of eight gate delays to the master clock signal output from the inverter 142. Thus, the master clock signal at the second input 149 of the first multiplexer 148 is delayed by eight gate delays from the clock signal at the first input 147 of the first multiplexer 148.

In the preferred embodiment, inverters are used to generate delay. It can be seen by one skilled in the art that any circuit element that generates delay may be used in place of the inverters shown in FIG. 4. Inverters are chosen as the delay elements in the preferred embodiment because they can be simply and inexpensively implemented by only a few transistors.

The signal for selecting which of the inputs 147 or 149 is to be provided at an output 150 of the first multiplexer 148 is generated by a first fuse circuit 160. The first fuse circuit 160 has a terminal 161. If the circuit illustrated in FIG. 4 is implemented on a chip, the terminal 161 is preferably a pad on the edge of the chip. This pad could later, during packaging, be connected to a package pin. The terminal 161 is connected to the input of an inverter 163. A resistor 164 is connected between the supply voltage and the input of the inverter 163. A fuse 166 is connected between the input of the inverter 163 and ground. The output 168 of the inverter 163 is connected to a select input 151 of the first multiplexer 148.

While the fuse 166 is intact, it pulls the input of the inverter 163 low. This causes the output of the inverter 163, which is provided to the select input 151 of the first multiplexer 148, to be high. A high signal at the select input 151 of the first multiplexer 148 selects the delayed line 146. Thus, while the fuse 166 is intact, the first multiplexer 148 outputs the clock signal from the inverter 142 with an added delay of eight gate delays.

The fuse 166 may be blown (i.e., opened) by providing a sufficient current at the terminal 161. The current will then flow through the fuse 166 and create heat which will cause it to melt and blow.

If the fuse 166 is blown, resistor 164 pulls the input of the inverter 163 high. This causes the output 168 of the inverter 163, which is provided to the select input 151 of the first multiplexer 148, to be low. A low signal at the select input 151 of the first multiplexer 148 selects the undelayed line 144. Thus, when the fuse 166 is blown, the first multiplexer 148 outputs the master clock signal from the inverter 142 without delay.

The signal at the output 150 of the first multiplexer 148 is provided to a second programmable delay block 170. Similar to the first programmable delay block 138, the second programmable delay block 170 has two lines which carry the signal on the output 150 from the first multiplexer 148 to a second multiplexer 172. An undelayed line 174 carries the signal directly to an input 175 of the second multiplexer 172. A delayed line 176 carries the signal through four inverters to an input 177 of the second multiplexer 172.

Similar to the first multiplexer 148, the second multiplexer 172 has a select input 178. A fuse circuit 180, identical to the first fuse circuit 160, selects which signal on either the undelayed line 174 or the delayed line 176 will be provided to an output 179 of the second multiplexer 172.

The fuse circuit 180, like the first fuse circuit 160, selects the delayed line 176 (delayed by four gate delays) while the fuse is intact. If the fuse is blown, the circuit outputs a low signal on the select input 178, causing the multiplexer 172 to output the signal from the previous first programmable delay block 138 undelayed.

The output 179 from the second programmable delay block 170 is input to a third programmable delay block 190. Like the previous programmable delay blocks, the third programmable delay block 190 has a third fuse circuit 200 which determines which signal of two lines, an undelayed line 191 or a delayed line 192, will be provided on an output 199 of a third multiplexer 198. Delayed line 192 is has two inverters in it, causing a delay equivalent to two gate delays. Undelayed line 191 and delayed line 192 are input to the third multiplexer 198 at an input 196 and at an input 197, respectively.

Like the previous fuse circuits, the output of the third fuse circuit 200 is connected to a select input 195 of the third multiplexer 198. When the fuse of the third fuse circuit 200 is intact, the third fuse circuit 200 causes the third multiplexer 198 to select the delayed line 192 to be provided on output 199. If the fuse is blown, the third fuse circuit 200 will cause the third multiplexer 198 to select the signal on the undelayed line 191 to be provided on the output line 199.

The output 199 from the third programmable delay block 190 is input to a fourth programmable delay block 200. Like the previous programmable delay blocks, the fourth programmable delay block transfers the signal on output line 199 to an undelayed line 211 and to a delayed line 212. Undelayed line 211 is connected to an input 213 of a fourth multiplexer 215. Delayed line 212 contains one buffer gate and is connected to an input 214 of the fourth multiplexer 215. Thus, the signal on delayed line 212 is one gate delay behind the signal on undelayed line 211.

Like the previous programmable delay blocks, the fourth programmable delay block 215 has a fourth fuse circuit 220.

The fourth fuse circuit 220 is connected to a select input 217 of the fourth multiplexer 215. When the fuse of the fourth fuse circuit 220 is intact, the fourth fuse circuit 220 causes the fourth multiplexer 215 to select the delayed line 212 to be provided on output 216. If the fuse is blown, the fourth fuse circuit 220 will cause the fourth multiplexer 215 to select the signal on the undelayed line 211 to be provided on the output line 216.

The output 216 is connected to a line 230 which carries the master clock signal CLK 1 (104-1), which is one of the outputs from the clock distribution circuit. The master clock signal CLK 1 (104-1) provides the master clock signal, with a selected delay, to one or more computer circuitry components to which it is connected.

In the embodiment of the present invention shown in FIG. 4, only four blocks of delay elements are implemented. There are, however, numerous other embodiments which have more blocks of delay elements. For example, an additional embodiment has an additional block with 16 delay elements. Further embodiments have additional blocks with 32, 64, etc. delay elements.

The circuit in FIG. 4 has been described so that delayed lines are selected at the multiplexers while the fuses are intact. It will be apparent to one of ordinary skill in the art that an alternate embodiment has the multiplexer inputs reversed so that as the fuses are blown, the delay will be increased.

A feedback loop 232 is connected between the output line 230 and an input of N:1 multiplexer 240. The other inputs of the multiplexer 240 are connected to the feedback loops for the other clock output signals CLK 1, . . . , CLK N (230). The output of the multiplexer 240 is connected to the input line 140 through a fuse 234. Multiplexer select lines 242 select which feedback lines are connected back to the input line 140. The multiplexer 240 ensures that only one feedback loop is connected with the input line 140 at any given time. Preferably, the multiplexer 240 is constructed so that it does not add delay to the feedback loop.

An N:1 multiplexer is a single-pole N-throw switch, usually implemented by N transistors. Each transistor connects one of the signal inputs to the output. A control circuit turns one of the transistors on and the others off in response to the state of the control input. In the preferred embodiment, the transistors are field-effect transistors. Except for when the selected input to the multiplexer is being changed, one of the transistors is continuously turned on and the others are continuously turned off, so there is preferably no significant delay introduced by them when either oscillation frequency is being measured or during normal operation of the circuit.

Feedback loop 232 creates a ring oscillator based on the delays caused by the programmable delay blocks (138, 170, 190 and/or 210) selected to be included in the CLK 1 master clock output path. It can be clearly seen from the circuit illustrated in FIG. 4 that the CLK 1 master clock output path will oscillate while the fuse 234 is intact. The inverter 142 insures that the number of inversions in the oscillator ring will be odd, thus guaranteeing oscillation.

The frequency of the clock output path is measured instead of the actual delay because a problem with test accuracy occurs when dealing with very short delays. In fast process technologies, such as GaAs, the longest possible delay of a clock output path is on the order of a few nanoseconds. Such short delay times are difficult to measure in normal automated test equipment used in production because the accuracy tolerances of the best test equipment is on the order of the few nanosecond delays being measured. Additionally, transmission line effects, such as reflections, corrupt the output wave forms, causing additional ambiguity in delay time measurement.

By constructing a ring oscillator as shown in FIG. 4, the frequency of the oscillation can be measured in order to determine the delay. Modern testers and frequency counters can measure the frequencies generated by the circuit in FIG. 4 much more accurately than by measuring the delay. Additionally, corruptions in the output waveform due to transmission line and other effects do not effect the frequency. A further advantage of the use of a ring oscillator to measure delay is that a comparatively inexpensive frequency counter may be used instead of a big, expensive chip tester which has the capability of accurately measuring delays in the few nanoseconds range.

It can be seen that regardless of the combinations of delay lines which are selected in the clock signal path, the number of inversions will always be odd because all of the delay lines will add an even number of inversions.

The delay line 212 in the fourth programmable delay block 210 is a buffer rather than an inverter because there is only one delay element to be added in this block. An inverter in this block would cause an even number of inversions and would thus prevent oscillation if the delayed line in the fourth programmable delay block was selected.

If some master clock outputs are desired to be inverted in phase from the other master clock outputs, an additional inverter may be added outside of the feedback loop. The additional delay provided by this additional inverter may be compensated for by adjusting the programmable delay elements in the master clock output path to take into account the additional delay. The amount of delay produced by the additional inverter may be approximated by measurements of typical inverter delays on the chip or on the wafer.

The invention is disclosed and described herein in the context of an unbalanced logic system, such as TTL or CMOS. It will be apparent to one skilled in the art that the methods and apparatus of the present invention may also be implemented in a balanced logic system, such as GaAs and others, without substantive difference from the unbalanced systems described herein.

In a balanced logic system, inverters are replaced by buffer amplifiers. An inverted phase master clock is generated by selecting an opposite polarity at one of the buffer amplifiers which is permanently connected in the master clock output path.

The frequency of oscillation caused by the feedback path in the programmed delay clock output path can be accurately measured to accurately determine the delay. The frequency, and thus the delay, is monitored while the delay circuit is programmed to reach the desired delay amount. The method of programming the delay in the circuit shown in FIG. 4 will is discussed in detail below.

Once the desired delay has been programmed, the fuse 234 in the feedback path is blown in order to eliminate the oscillation. To facilitate blowing the fuse 234, a solder pad 236 is connected to one side of the fuse 234 and a solder pad 238 is connected to the other side. The fuse 234 is blown by providing a sufficient current between the solder pads 236 and 238.

As can be seen from FIG. 4, the inverters used as delay elements are grouped in powers of two. This "binary weighting" allows any number of 16 delays (from zero to fifteen gate delays) to be programmed with only four fuses. Additional embodiments of the present invention may have additional programmable delay blocks. For example, some embodiments have programmable delay blocks with 16, 32, 64, or more delay elements.

For example, if it is desired to program eleven gate delays (binary number 1011), then the fuse in the second fuse circuit would be blown by the test equipment programming the delay. This would cause the second programmable delay block to select its undelayed line. Because the fuses in the first, third and fourth programmable delay blocks are left intact, those programmable delay blocks select their delayed lines. Thus, the path from CLK IN to CLK 1 goes through eight gate delays at the first programmable delay block, no gate delays at the second programmable delay block, two gate delays at the third programmable delay block and one gate delay at the fourth programmable delay block. This gives a total of eleven gate delays.

Of course, the inverter 142 will inherently add some delay to the clock output path. Additionally, each of the multiplexers in the programmable delay blocks will inherently add some delay to the clock output path. However, these delays are constant and will remain regardless of the programming of the programmable delay blocks. The test program which programs the delay blocks takes these constant delays into account by simply subtracting them out of the measured delays from the master clock output path.

The single delay element in the delay line 212 in the fourth programmable delay block 210, as discussed earlier, is a straight buffer in the preferred embodiment, rather than an inverter like all of the other programmable delay elements. Because the buffer is not an inverter, it will produce a gate delay slightly different from the gate delays produced by the inverters in the programmable delay blocks which have nearly identical gate delays because they are produced so close to each other on the chip.

Figure 5A:
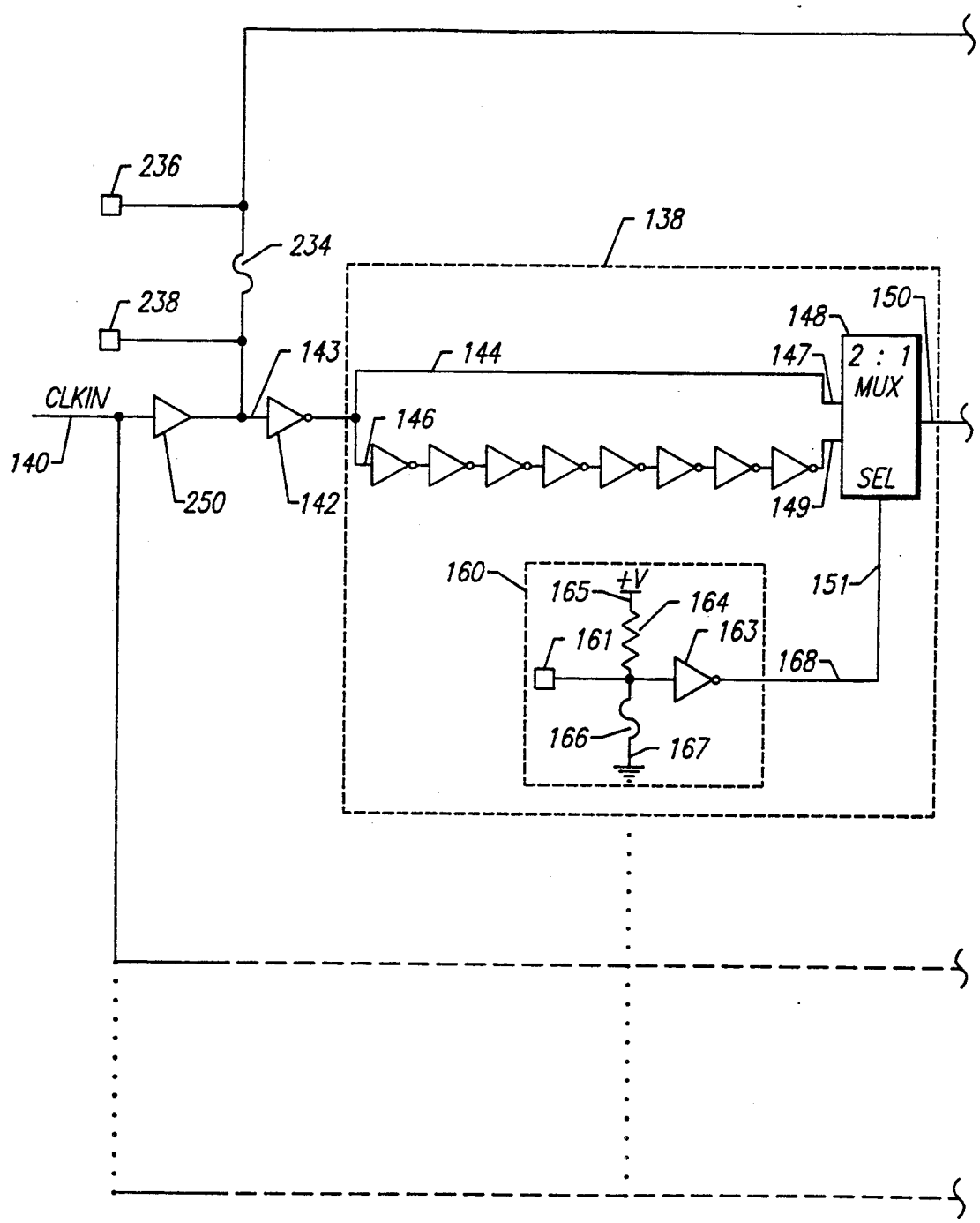
FIG. 5a and 5b illustrate a clock distribution circuit constructed in accordance with an alternative embodiment of the present invention.
Figure 5B:
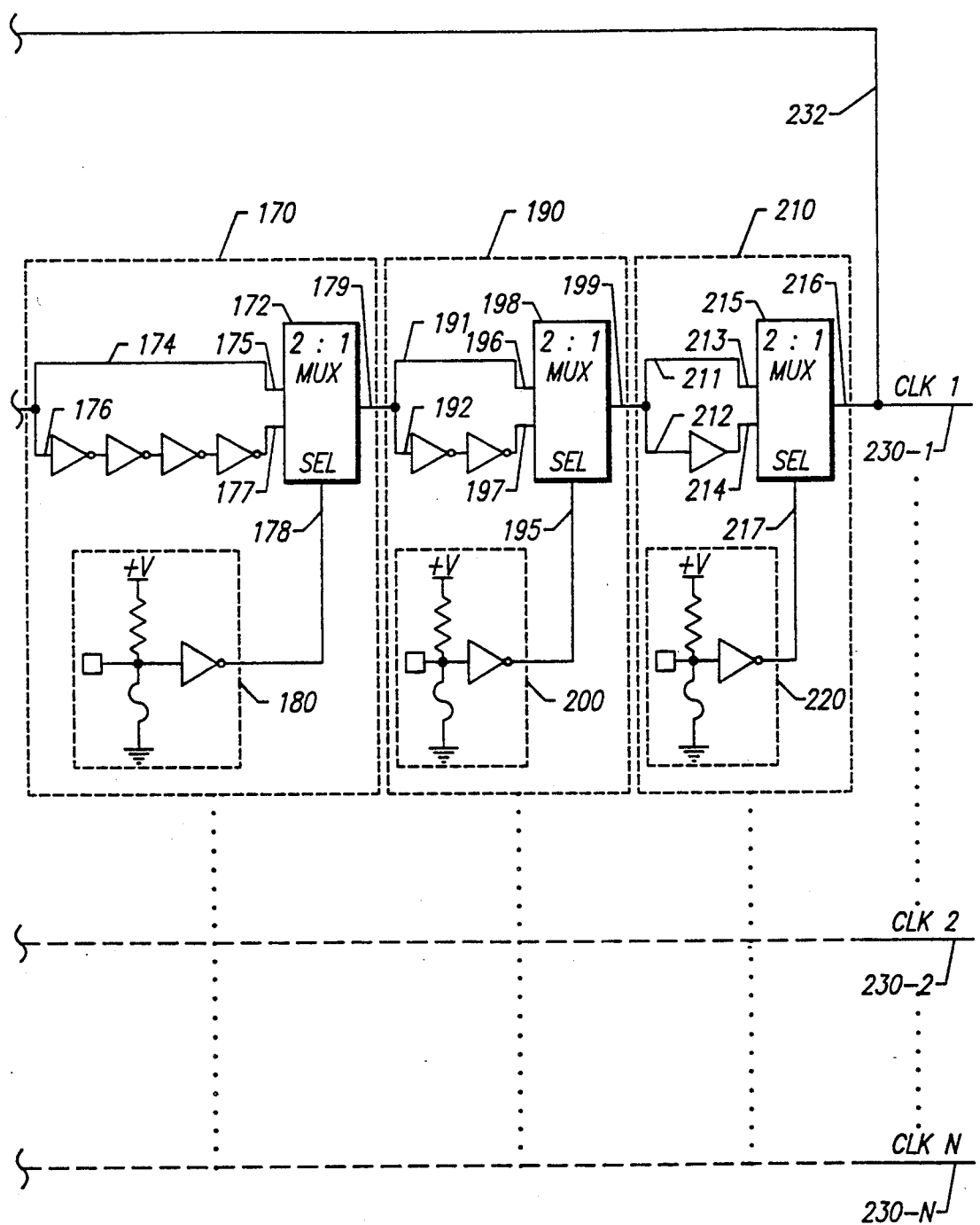

An alternative embodiment of the present invention is shown in FIG. 5. Multiplexer 240 has been removed and a buffer 250 is added between the line 140 (CLK IN) and the inverter 142. The feedback path 232 is connected between the buffer 250 and the inverter 142 such that the buffer 250 isolates the feedback path of the CLK 1 clock output path from the feedback paths of the remaining clock output paths.

The multiplexer 240 of FIG. 4 or the buffer 250 of FIG. 5 could be eliminated by using a single feedback path for all of the clock output paths. In this way, the single feedback path would be connected on one end to the clock input line 140. The other end of the single feedback path would be connected to a solder pad on the chip. The feedback path could then be connected externally to the output of the clock output path being programmed. This use of a single feedback path would eliminate the need for the fuse 234 since the solder pad connected to the single feedback path would be left open once the clock output paths have been programmed.

In the embodiment shown in FIGS. 4 and 5, inverters are used to generate delay. However, any other devices for generating delay can be used in place of the inverters shown in FIGS. 4 and 5. For example, an RC network may be utilized. Such an alternative embodiment of the present invention is shown in FIG. 6.

Figure 6:
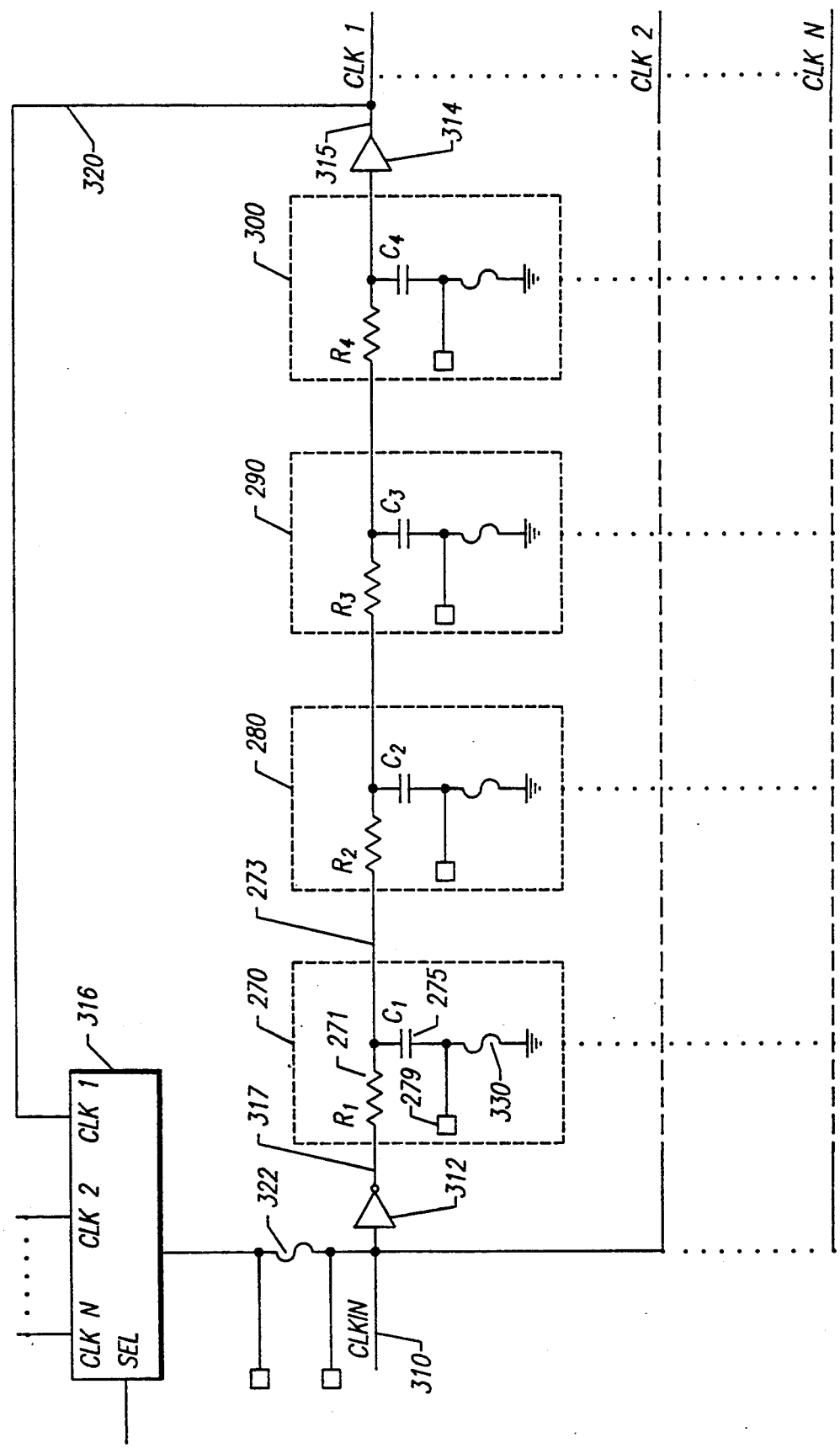
FIG. 6 illustrates a clock distribution circuit constructed in accordance with another alternative embodiment of the present invention.

As in the embodiment of FIGS. 4 and 5, the alternative embodiment of FIG. 6 contains four programmable delay blocks: a first programmable delay block 270, a second programmable delay block 280, a third programmable delay block 290, and a fourth programmable delay block 300. The signal CLK IN on line 310 is input to an inverter 312. The output from the inverter 312 is provided to the four programmable delay blocks. The output of the fourth programmable delay block is input to a buffer 314. The output of the buffer 314 is output on a line 315, which carries the signal CLK 1. A feedback loop 320 is connected between the line 315 and a multiplexer 316. The output of the multiplexer 316 is provided, through a fuse 322, to the line 310, just as in the embodiment shown in FIGS. 4 and 5.

The output of the inverter 312 is provided on a line 317 to the first programmable delay block 270. The line 317 is connected to a resistor 271. The other side of the resistor 271 is connected to a line 273, which is the output of the first programmable delay block 270 and is the input of the second programmable delay block 280. The other side of the resistor 271 is also connected to a capacitor 275. The other end of the capacitor is connected to a terminal 279. The terminal 279 may be a pad on a chip. The other side of the capacitor 275 is also connected to a fuse 330. The other end of the fuse 330 is connected to ground.

The resistor 271 has a resistance value $R_1$. The capacitor 275 has a capacitance value $C_1$. When the fuse 330 is intact, the first programmable delay block 270 adds a delay proportional to the time constant $R_1C_1$ to the clock signal at the input 317 of the first programmable delay block 270. The delayed signal is provided at the output 273 of the first programmable delay block 270.

The first programmable delay block 270 may be selected not to add delay to the signal at its input. In order to perform this deselection of the first programmable delay block 270, the fuse 330 is blown by providing a sufficient current at the terminal 279. Once the fuse 330 has been blown, the capacitor 275 will be disconnected and will not have any effect on the signal travelling through resistor 271. Thus, by blowing fuse 330 of the first programmable delay block 270, the first programmable delay block 270 may be selected so as to not add any delay.

The second programmable delay block 280, the third programmable delay block 290 and the fourth programmable delay block 300 all operate in a similar manner to the first programmable delay block 270. The only difference between these programmable delay blocks is that their R and C values can be varied. Preferably, the R and C values of the programmable delay block are chosen such that they are binary-weighted in value. In this way, the RC time constant of the first programmable delay block 270 is twice as great as the RC time constant of the second programmable delay block 280, which is twice the RC time constant of the third programmable delay block 290, which is twice the RC time constant of the fourth programmable delay block 300.

This binary-weighting provides nearly the same result as the programmable delay blocks in FIGS. 4 and 5. The only difference between the delay blocks of the embodiment of FIG. 6 and the delay blocks of the alternative embodiment of FIGS. 4 and 5 is that in the alternative embodiment of FIG. 6, when a delay block is selected not to add delay to the clock signal, the resistor will then be connected in series with the resistor of the following delay block. Thus, deselecting a programmable delay block affects the RC value of delay provided by a subsequent programmable delay block. For example, if the first programmable delay block 270 is deselected and the second programmable delay block 280 is selected to add delay, the amount of delay added will be proportional to the time constant $(R_1+R_2)C_2$. This differs from the case where the second programmable delay block 280 adds a delay proportional to the time constant $R_2C_2$ if the first programmable delay block 270 is selected.

Embodiments of the present invention which use an RC network to produce delay are most appropriate for MOS technologies because the buffer at the end of the clock output path (e.g., the buffer 314 in FIG. 6) will require significant current in technologies other than MOS. The resistors required in an RC network limit the current available to the buffer. If the current is not sufficient, the buffer will not operate properly. Thus, it is recommended that an RC network embodiment be used preferably in MOS technologies.

Figure 7:
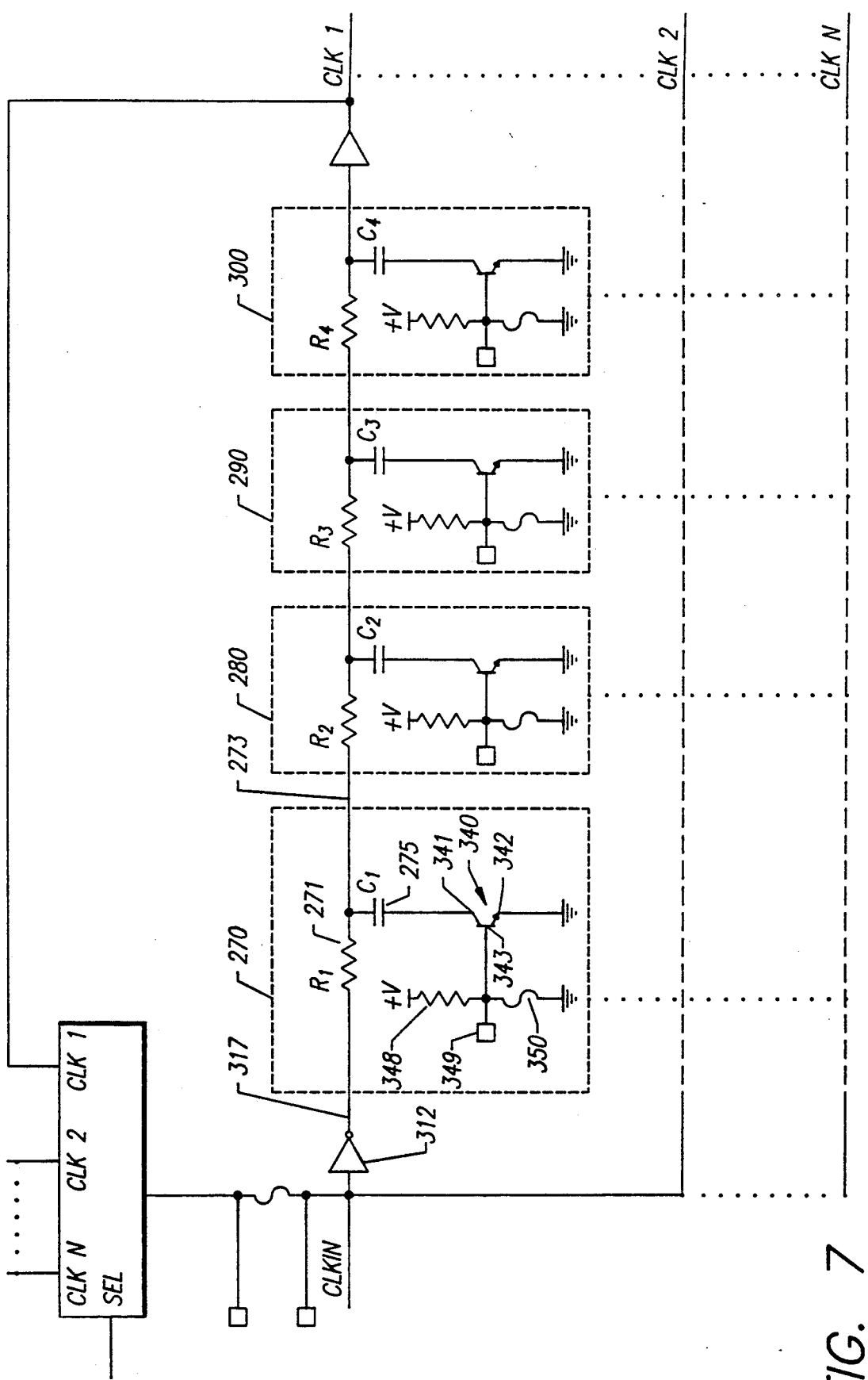
FIG. 7 illustrates a clock distribution circuit constructed in accordance with another alternative embodiment of the present invention.

Another alternative embodiment of the present invention which also uses an RC network is shown in FIG. 7. In this embodiment, a fuse is used in selecting each programmable delay block. Like the embodiment in FIG. 6, the output of the inverter 312 is connected to the resistor 271 via the line 317. The other end of the resistor 271 is connected to the line 273, which is connected to the second programmable delay block 280 and the capacitor 275. The capacitor 275 is connected at the other end to the collector 341 of a bipolar transistor 340. The emitter 342 of the bipolar transistor 340 is connected to ground. The base 343 of the bipolar transistor 340 is connected to a resistor 348, a terminal 349, and a fuse 350. The fuse 350 is connected at its other end to ground. The resistor 348 is connected at its other end to the supply voltage.

While the fuse 350 is intact, the base 343 of the bipolar transistor 340 is connected to ground. This prevents a current path between the collector 341 and the emitter 342. This causes the capacitor 275 to be disconnected from the first programmable delay block 270. Thus, while the fuse 350 is intact, the capacitor 275 is disconnected from the line 273 carrying the clock signal and the first programmable delay block 270 does not add any delay to the signal at the input on line 317.

The fuse 350 may be blown by applying a sufficient current at the terminal 349. When the fuse 350 is blown, the base 343 of the bipolar transistor 340 is pulled up by the resistor 348. This causes the transistor 340 to turn on, connecting the capacitor 275 to ground. This causes the capacitor 275 to add a delay proportional to $R_1C_1$ to the signal on line 317 at the input of the first programmable delay block 270. Thus, by blowing the fuse 350, the first programmable delay block is selected to add delay to the signal on the line 317 at the input of the first programmable delay block 270.

It will be apparent to one skilled in the art that the a FET transistor may be used in place of bipolar transistor 340.

The second, third, and fourth programmable delay blocks operate identically to the first programmable delay block 270. The only difference among the programmable delay blocks is that they preferably have RC values chosen in a binary-weighted fashion, similar to the embodiments shown in FIGS. 4, 5 and 6.

It can be seen that inverters and RC networks are two examples of many ways in which to selectively add delay to a clock output circuit. Any other means of producing delay may also be used in different embodiments of the present invention.

In the various embodiments of the present invention which have been described so far, once the fuses have been blown, the delay of the circuit is fixed. Stated differently, once the selected programmable delay blocks have been switched in or switched out by blown fuses, the programmable delay blocks which contain blown fuses are permanently in their switched in or switched out state.

Figure 8:
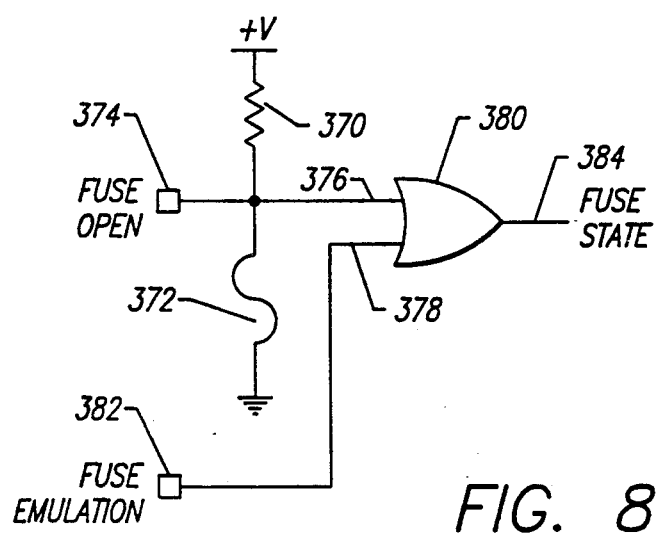
FIG. 8 illustrates a fuse emulation circuit which is incorporated into the alternative embodiments of the present invention as shown in FIGS. 4, 6 and 7.

In another aspect of the present invention, a blown fuse may be emulated before the fuse is actually blown. A fuse emulation circuit that performs this function is shown in FIG. 8. In the fuse emulation circuit of FIG. 8, a resistor 370 is connected to the supply voltage on one end. On the other end, the resistor 370 is connected to a fuse 372, a terminal 374, and an input 376 of an OR gate 380. The terminal 374 may comprise a pad on the edge of a chip. The other end of the fuse 372 is connected to ground. The OR gate 380 has one other input 378. The input 378 of the OR gate 380 is connected to a fuse emulation terminal 382, which may comprise a pad on the edge of a chip. The OR gate 380 has an output 384.

As can be seen from the circuit of FIG. 8, when the fuse 372 is intact, the input 376 of the OR Gate 380 is pulled low. Thus, the output 384 of the OR Gate 380 will be high only when the terminal 374 is raised high. The terminal 374 is thus used to emulate an blown fuse.

The fuse 372 may be blown by providing a sufficient current at the terminal 374. When the fuse 372 is blown, resistor 370 will pull input 376 of the OR gate 380 high. Thus, once the fuse 372 has been blown, the OR gate 380 will always output a high signal.

The fuse emulation terminal 382 is used to emulate a blown fuse while the fuse 372 remains intact. While the fuse 372 is intact, the output 384 of the OR gate 380 will be high only when the signal provided at the fuse emulation terminal 382 is high.

The circuit of FIG. 8 can be used in nearly any of the embodiments of the present invention. For example, the fuse emulation circuit of FIG. 8 can be used in place of the fuse circuits of FIGS. 4 and 5. In this way, the line 384 representing the fuse state may be connected to a select input of one of the multiplexers. By providing signals emulating blown fuses at the fuse emulations terminals, the clock output delay circuit may be tested to determine whether the selected fuse blowing pattern is correct. If the fuse blowing pattern is not correct, the pattern may be modified and emulated until the proper pattern has been determined. Once the proper fuse blowing pattern has been determined, the fuses may be blown in accordance with the emulated pattern. Thus, the fuse emulation circuit of FIG. 8 allows for verification of the desired fuse blowing pattern before the pattern is permanently set.

In the embodiments of the invention described thus far, only fuses have been utilized to permanently switch in or switch out programmable delay blocks. However, any switching means for permanently delivering a high or low signal value to switch in or switch out each of the programmable delay blocks may be utilized. One substitute for a fuse could be any type of memory, such as a ROM or a RAM. Such an example of a memory device 400 is shown in FIG. 9A. If the memory is a PROM, then the memory may be programmed with the appropriate programmable delay block pattern once the pattern has been determined. Then the pattern will be fixed in the memory permanently by selecting the desired programmable delay block pattern.

Output memory lines 402 would be connected to the terminals of the programmable delay blocks which determine whether an individual block will be switched in or switched out of the master clock output path. For example, the memory output lines 402 of the memory line 400 FIG. 9A would be connected to the select inputs of the 2:1 multiplexers of each of the programmable delay blocks in FIGS. 4 and 5. The fuse circuits of FIGS. 4 and 5 would thus be eliminated.

In FIG. 7, the outputs from the memory of FIG. 9A would be connected through resistors to the bases of each of the transistors of each of the programmable delay blocks. The resistors, the input terminals, and the fuses of FIG. 7 would of course be eliminated.

The memory 400 of FIG. 9A could also be a RAM or a latch. In a RAM or a latch embodiment, the memory or latch must be loaded with the desired programmable delay block selection pattern every time the circuit is powered up. This would be done through input lines 404. This could be done by a separate controller which automatically loads the desired values upon a power on reset signal.

The memory 400 of FIG. 9A could also be an EPROM, an EEPROM, or the like. Then, if the chosen programmable delay block selection pattern is incorrect after setting or is otherwise desired to be changed to reach a different target delay, the EPROM may be erased and reset by the user.

Figure 9B:
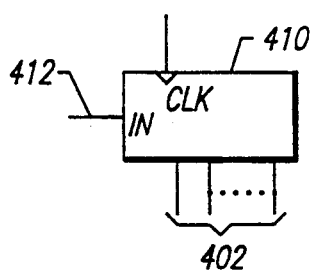
FIG. 9B illustrates a shift register which is incorporated into the alternative embodiments of the present invention as shown in FIGS. 4, 6 and 7.

Yet another means for selecting programmable delay blocks is a shift register 10 (or FIFO RAM), shown in FIG. 9B. The shift register is similar to a RAM memory in that the programmable delay block patterns must be reloaded every time the circuit is powered up. The advantage of a shift register over a RAM is that there is only one input line 412, which requires only one pin on the chip for externally loading the proper programmable delay block pattern. A RAM memory, on the other hand, requires one input line, and thus one pin, for each output data line connected to a programmable delay block selection means. Like a RAM, the shift register can be used either to store the delay pattern during actual use of the circuit, or to load the emulation pattern during programming of the circuit.

Figure 1:
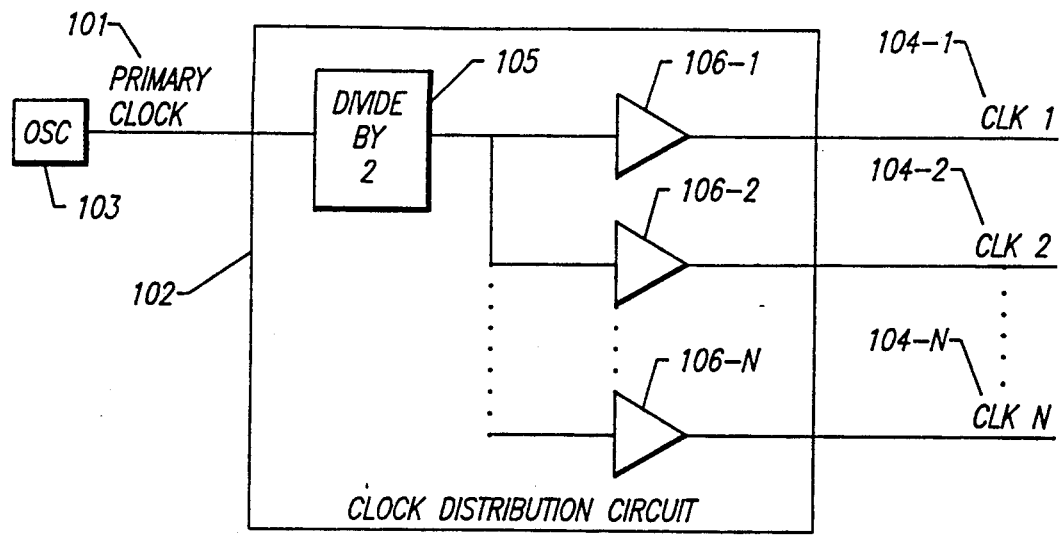
FIG. 1 illustrates a prior art clock distribution circuit.
Figure 2:
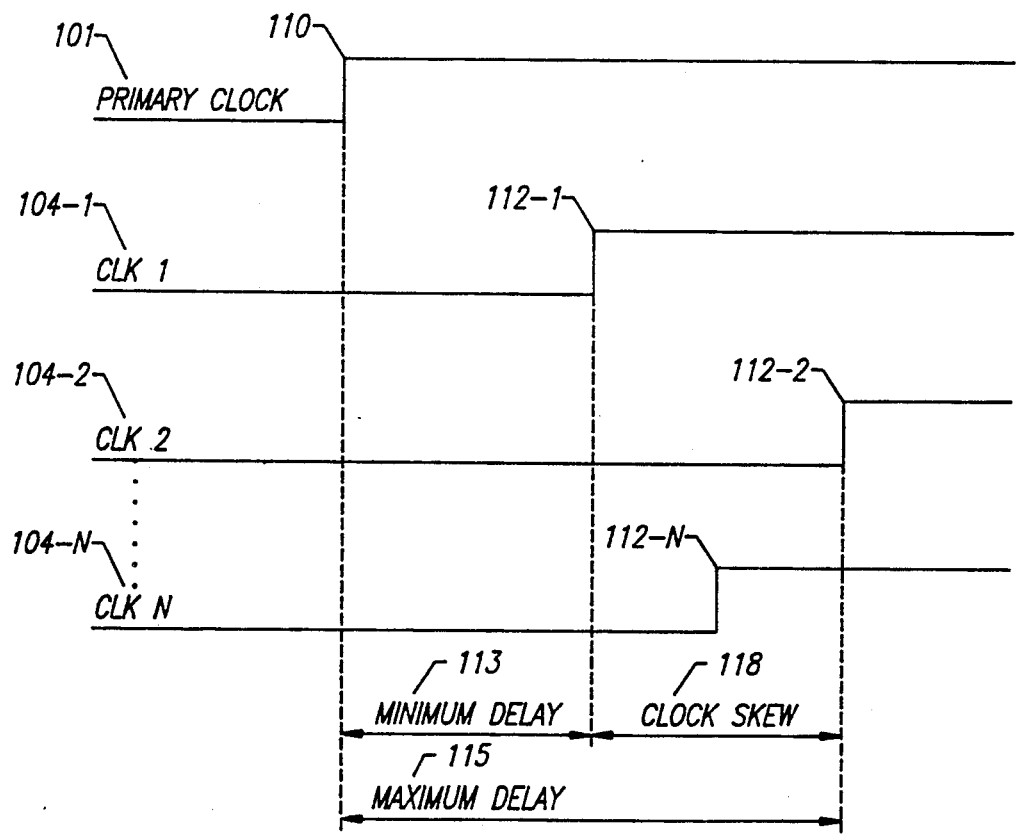
FIG. 2 illustrates minimum delay, maximum delay, and clock skew in the prior art clock distribution circuit outputs shown in FIG. 1.
Figure 3:
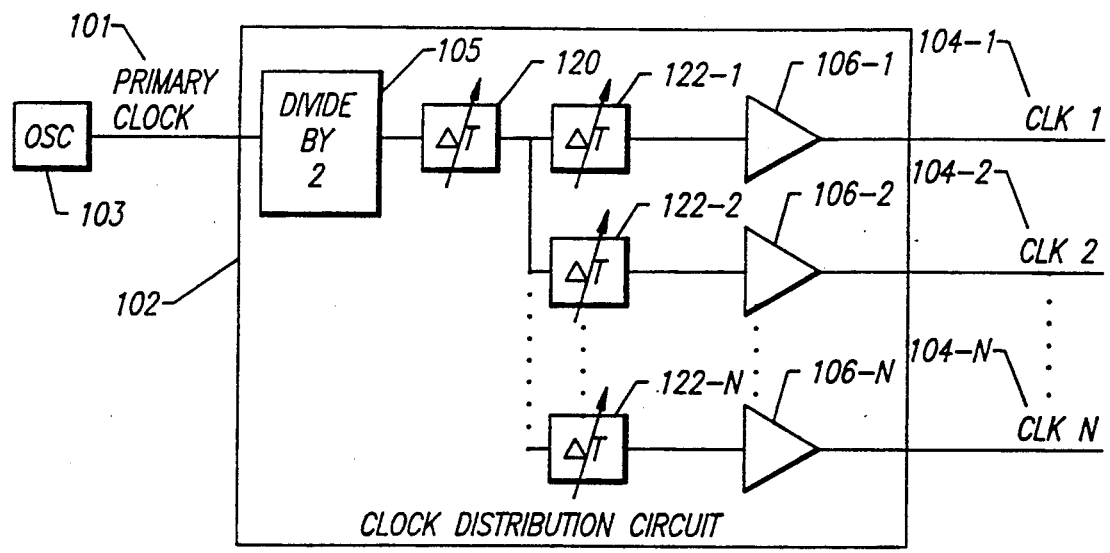
FIG. 3 illustrates a prior art method of compensating for clock skew in the clock distribution circuit shown in FIG. 1.
Figure 10:
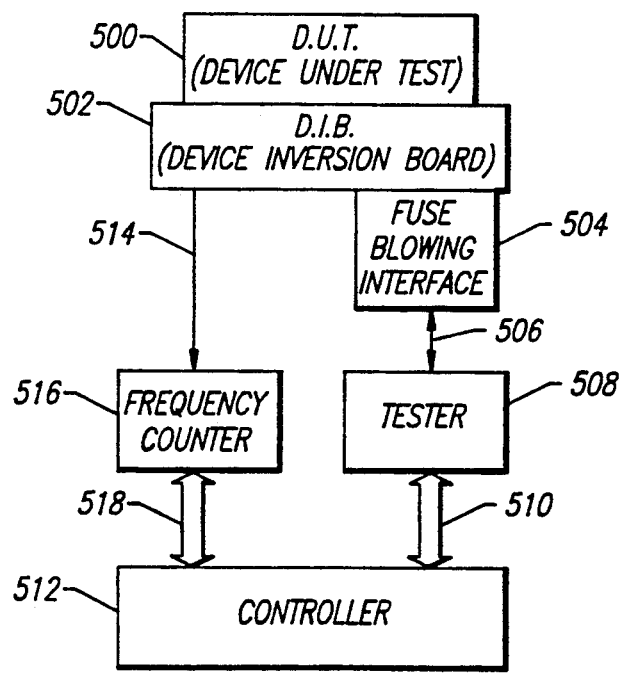
FIG. 10 is a block diagram of a test circuit used to measure and adjust delays in clock output paths in accordance with the present invention.

FIG. 10 illustrates the testing set up which measures and sets each of the clock output delays. A Device Under Test ("DUT") 500 is connected to a Device Insertion Board ("DIB") 502. The DUT 500 is a packaged clock distribution chip or another device incorporating the apparatus and methods of the present invention. A Fuse Blowing Interface ("FBI") 504 is connected to the DIB 502. The FBI 504 blows the desired fuses when the desired fuse blowing pattern has been determined.

A line 506 connects the FBI 504 to a tester 508. A typical tester is the Teradyne Model J953. Line 506 is bidirectional so that the tester may generate signals, such as fuse blowing signals, and also measure signals generated by the DUT 500.

A bus 510 connects the tester 508 to a controller 512. The bus 510 carries commands from the controller 512 to the tester 508, and carries data from the tester 508 back to the controller 512.

A line 514 is connected between the DIB 502 and a frequency counter 516. The line 514 carries the oscillations caused by the feedback loops of the present invention to the frequency counter 516. The frequency counter 516 measures the frequency provided on the line 514.

A bus 518 is connected between the frequency counter 516 and the controller 512. The bus 518 carries the value of the frequency measured by the frequency counter 516 to the controller 512 and carries commands from the controller 512 to the frequency counter 516.

The controller 512 can be any microprocessor. The controller 512 executes a program which selects the fuses to be blown by comparing the frequency generated by each oscillating loop with the predetermined target frequency. The program for determining the fuses to be blown will now be described.

Figure 11:
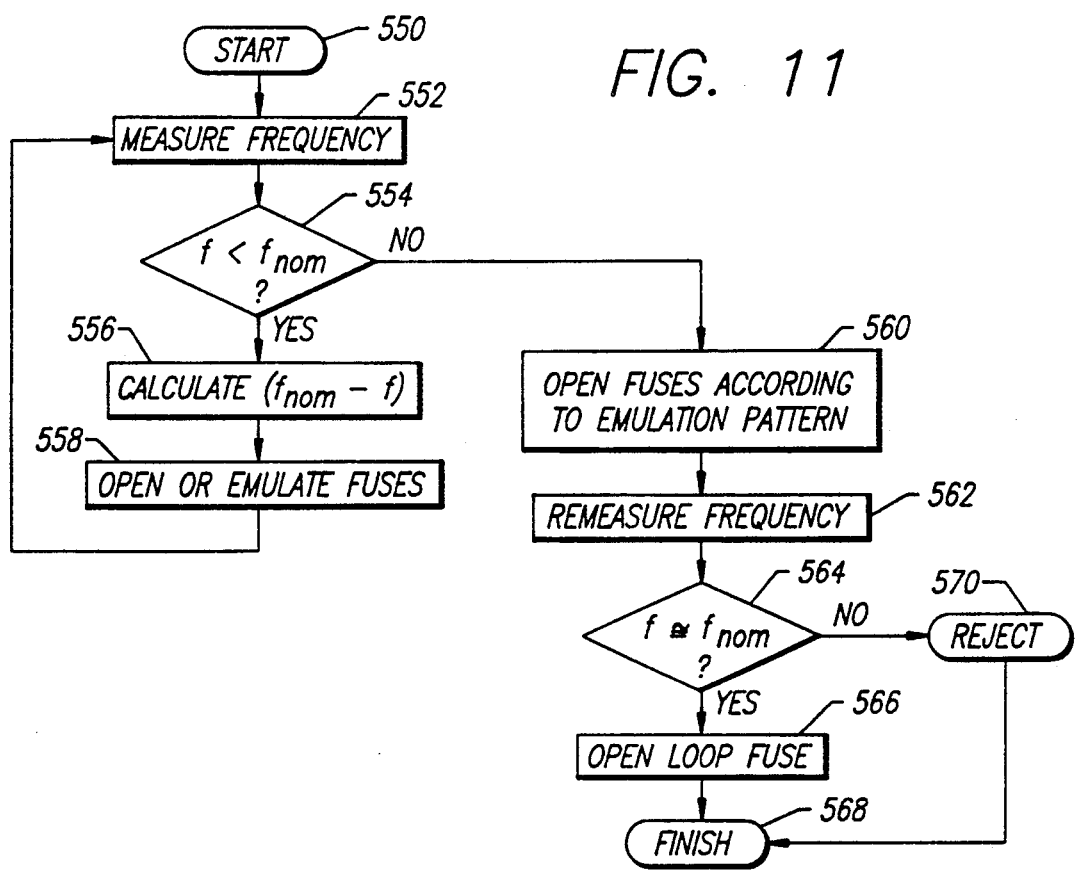
FIG. 11 is a flow chart showing a method of measuring and adjusting delays in clock output paths in accordance with the present invention.

The fuse blowing algorithm is shown by a flow chart in FIG. 11. The flow chart of FIG. 11 shows the method for blowing fuses for one master clock output. Before each output is tested by the algorithm shown in FIG. 11, the chip is first measured to determine the target delay, the delay which each of the clock outputs of the chip will be programmed to be within a predetermined range of.

For each of the clock outputs to be programmed, the program executed by the controller 512 begins execution at START block 550. From there, execution continues to block 552, where the frequency of the ring oscillator in the clock output path being tested is measured.

Execution continues to decision block 554. Here, the measured frequency is compared with the target frequency. In one embodiment, the programmable delay circuit is initially designed so that the delay before programming is preferably longer than the target delay. The circuit is designed so that all of the programmable delay elements are switched into the clock output path while the fuses are intact.

If the measured frequency is less than the target frequency, execution continues at block 556. At block 556, the controller 512 calculates the difference between the measured frequency and the target frequency. By use of a lookup table, the controller 512 determines which fuse to blow to bring the delay close to but not less than the target delay. The first fuse may be anywhere from 50% to 90% (or whatever is deemed reasonable) of the required change in delay.

For a given measured frequency and a given difference between the measured frequency and the target frequency, the lookup table indicates the fuse to be blown in order to bring the delay close to the target delay. Both the measured frequency and the difference from the target frequency are needed in order to determine delay because of the non-linear relationship between frequency and delay. In order for the lookup table to indicate the fuse to be blown, the program that builds the initial lookup table must be given the typical delay for the delay element used (e.g., inverter, RC network, etc.). This can be determined from initial tests of the wafer on which the chip is produced.

Execution continues at block 558, where the selected fuse is blown. If the circuit has been constructed with the ability to emulate an blown fuse, the fuse is emulated as if it had been blown. If means for selecting programmable delay blocks with switching means other than fuses is implemented, then the selected programmable delay block is switched out of the master clock output path.

Execution continues back to the block 552, where the oscillation frequency is measured again. The execution loop continues until the measured frequency is as close as possible to the target frequency at decision block 554. Once this is the case, execution continues at a block 560.

At block 560, if the fuses have not already been blown, the fuses are blown according to the emulated pattern determined from the previous steps. If means for selecting programmable delay blocks other than by the use of fuses is implemented, those means are adjusted to permanently select the programmable delay blocks according to the pattern selected by the previous steps.

Execution then continues at a block 562. At block 562, the frequency of the clock output path is measured again. Then, at a decision block 564, the frequency measured is again compared with the target frequency. If the frequency measured is within a predetermined tolerable range of the target frequency, execution continues at a block 566. At block 566, the tester 508 sends a command to the FBI 504 to blow the feedback loop fuse 234 (FIGS. 4 and 5) of the clock output path being measured. Execution then proceeds to a FINISH block 568. The algorithm may next be executed for the next chip or the next master clock output path.

If it is determined at decision block 564 that the remeasured frequency is outside the tolerable range of the target frequency, then execution continues at a block 570. At block 570, the chip is rejected because the program was unable to properly program the clock output delay. Execution then continues to the FINISH block 568.

DETAILED EXAMPLE

It will be apparent to one skilled in the art that the circuit may be designed so that all of the programmable delay elements are switched out of the master clock output path while the fuses are intact. In that case, fuses may be blown in order to add to delay to bring the measured frequency down to the normal frequency.

The following is an example of the delay block programming algorithm of FIG. 11 with the circuit of FIG. 5. An exemplary chip has six outputs. The clock frequency is 50 MHz and the clock input duty cycle is 50%. The clock period is thus 20 ns. The target clock delay through the chip is determined to be 6.5 nns.

Because the frequency of a ring oscillator is $\frac{1}{t_d}$, where $t_d$ is the delay through the ring oscillator path, the target frequency, $f_t$, is 76.923 MHz for a target delay of 6.5 nns. The tolerable skew is 300 ps.

At block 552 of FIG. 11, the frequency of the oscillator through the first clock output path is measured to be 63.5 MHz. At block 554, the measured frequency is determined to be below that of the target frequency. Therefore, execution continues at block 556, where the difference between the target frequency and the measured frequency is calculated. Execution then continues to block 558 where the measured frequency and the difference between the measured frequency and the target frequency are input to a lookup table. The difference between the measured frequency and the target frequency corresponds to a delay of 1370 ps. The typical gate delay measured for the wafer is 250 ps. Therefore, the lookup table indicates that 5.48 gate delays must be removed from the clock output path. This is approximated by switching out the 4 gate delay block and the 2 gate delay block. This is done by either blowing fuses or emulating blown fuses.

Execution continues at block 552 where the frequency of the ring oscillation through the clock output path is measured to be 74.07 MHz. Execution continues to decision block 554 where the measured frequency is compared with the target frequency. The difference between the measured frequency and the target frequency corresponds to a difference in delays of 250 ps. Because this is less than 300 ps, execution branches to block 560. At block 560, the fuses previously emulated are blown. Execution then continues to block 562. At block 562, the frequency of the ring oscillator is again measured. The frequency is measured to be 74.07 MHz.

Execution continues to a decision block 564. At decision block 564, the remeasured frequency is compared with the target frequency. Because the remeasured frequency indicates that the delay is within 200 ps of the target delay, execution continues to block 566. At block 566, the tester issues a command to the FBI 504 to blow the feedback loop fuse. Execution continues to FINISH block 568. This completes the clock skew adjustment for one clock output path.

All of the embodiments of the present invention thus far discussed have shown an implementation as a single clock distribution chip. However, other implementations of the present invention are possible.

Another alternative embodiment of the present invention is in a microprocessor on a single chip. The circuitry embodying the apparatus and methods of the present invention could be located on one portion of the chip. Oscillation feedback paths would stretch from the end of the clock output paths, at the locations receiving the clock signals, and connect back to the beginning of the clock output paths. Then, each of the generated ring oscillations would be separately adjusted so that they are as identical as possible, thus adjusting the clock output delays so that the clock signals arrive at each of the components at the same time. The master clock output delays may be tested and programmed by a tester before programming by using the pads on the edge of the chip. In this way, the pads would not need to be attached to pins on the chip package, thus reducing required pins on the package.

In such an alternative embodiment, the goal is not to assure that the skew at the immediate outputs of the clock distribution circuitry is minimized, but is to minimize the skew between the master clock signals at the various delivery points.

Yet another alternative embodiment is in a hybrid integrated circuit. One of the chips in the hybrid would contain circuitry embodying the methods and apparatus of the present invention. Feedback paths would lead from pads connected to the clock output signal delivery points back to pads on the clock distribution chip. All of the feedback paths must be the same length so that they each introduce the same amount of delay. In this way, if all of the oscillation loops are set to the same frequency, this will guarantee that the clock output signals will arrive at their destinations at the same time, thus eliminating skew.

Still another alternative embodiment of the present invention could be on a PC board. Feedback paths would be connected between the clock signal output destinations to feedback input pins on a chip embodying the methods and apparatus of the present invention. The feedback paths must be chosen to be of the same length so that they introduce an equivalent amount of delay. If the chip is adjusted by a PC board tester so that each of the feedback oscillations oscillate at the same frequency, then all of the clock output signals will arrive at their destinations at the same time. In this way, skew will be introduced between the clock outputs at the clock distribution chip in order to eliminate skew at each of the destinations of the clock output signals.

Although the present invention has been described with reference to a computer system, it will be evident to one skilled in the art that the methods and apparatus disclosed herein are readily applicable to digital logic systems in general.

While the invention has been described with reference to preferred embodiments thereof, it will be understood by those skilled in the art that various changes in form and details may be made without departing from the scope of the invention, which is defined by the appended claims.

What is claimed is:

1. A clock distribution circuit for use in a digital logic system, said digital logic system including a primary clock signal and a plurality of digital logic system components, said clock distribution circuit producing from said primary clock signal a plurality of master clock signals on a plurality of master clock output lines, one or more of said digital logic system components receiving a master clock signal on one of said master clock output lines, said clock distribution circuit comprising:

for each master clock output line, means for generating a time delay between said primary clock signal and said master clock signal on said master clock output line, said time delay generating means comprising a series of delay elements, each of said series of delay elements further including one or more subseries of delay elements, each said subseries of delay elements for generating a portion of said time delay, and each of said subseries coupled to a switching means, said switching means for controlling whether said subseries provides said portion of said time delay, said switching means including a fuse;

means for automatically controlling said time delay generated by said time delay generating means for ensuring that differences among delays between said primary clock signal and said master clock signals on said master clock output lines are within a predetermined time range; and means for emulating a fuse in its blown state before said fuse is blown.

2. A clock distribution circuit for use in a digital logic system, said digital logic system including a primary clock signal and a plurality of digital logic system components, said clock distribution circuit producing from said primary clock signal a plurality of master clock signals on a plurality of master clock output lines, one or more of said digital logic system components receiving a master clock signal on one of said master clock output lines, said clock distribution circuit comprising:

for each master clock output line, means for generating a time delay between said primary clock signal and said master clock signal on said master clock output line, said time delay generating means comprising a series of delay elements, each of said series of delay elements further including one or more subseries of delay elements, each said subseries of delay elements for generating a portion of said time delay, and each of said subseries coupled to a switching means, said switching means for controlling whether said subseries provides said portion of said time delay, said switching means comprising a transistor; and means for automatically controlling said time delay generated by said time delay generating means for ensuring that differences among delays between said primary clock signal and said master clock signals on said master clock output lines are within a predetermined time range.

3. A clock distribution circuit for use in a digital logic system, said digital logic system including a primary clock signal and a plurality of digital logic system components, said clock distribution circuit producing from said primary clock signal a plurality of master clock signals on a plurality of master clock output lines, one or more of said digital logic system components receiving a master clock signal on one of said master clock output lines, said clock distribution circuit comprising:

for each master clock output line, means for generating a time delay between said primary clock signal and said master clock signal on said master clock output line, said time delay generating means additionally comprising a feedback loop connected across said time delay generating means, said feedback loop for generating an oscillating signal having a frequency inversely proportional to said time delay; and means for automatically controlling said time delay generated by said time delay generating means for ensuring that differences among delays between said primary clock signal and said master clock signals on said master clock output lines are within a predetermined time range.

4. The clock distribution circuit of claim 3, further comprising means for measuring the frequency of said oscillating signal.

5. The clock distribution circuit of claim 4, wherein said frequency measuring means comprises a tester.

6. A clock distribution system in a digital logic system, said clock distribution system producing one or more master clock output signals from a primary clock signal, said clock distribution system for allowing automatic adjustment of delay between said primary clock signal and each master clock output signal, said clock distribution system comprising:

one or more master clock driver circuits, each master clock driver circuit having a plurality of delay elements, said delay elements being grouped into blocks wherein a first delay block contains one delay element, a second delay block contains two delay elements, a third delay block contains four delay elements, and a fourth delay block contains eight delay elements, each master clock output signal being generated by a separate one of said master clock driver circuits; and one or more switching means in each master clock driver circuit, said switching means for allowing one or more delay blocks to be switched into or switched out of said master clock driver circuit in order to increase or decrease the delay between said primary clock signal and said master clock output signal from said master clock driver circuit.

7. A clock distribution system in a digital logic system, said clock distribution system producing one or more master clock output signals from a primary clock signal, said clock distribution system for allowing automatic adjustment of delay between said primary clock signal and each master clock output signal, said clock distribution system comprising:

one or more master clock driver circuits, each master clock driver circuit having a plurality of delay elements, each master clock output signal being generated by a separate one of said master clock driver circuits; and one or more switching means in each master clock driver circuit, said switching means for allowing one or more delay elements to be switched into or switched out of said master clock driver circuit in order to increase or decrease the delay between said primary clock signal and said master clock output signal from said master clock driver circuit, said switching means including a read only memory (ROM).

8. A clock distribution system in a digital logic system, said clock distribution system producing one or more master clock output signals from a primary clock signal, said clock distribution system for allowing automatic adjustment of delay between said primary clock signal and each master clock output signal, said clock distribution system comprising:

one or more master clock driver circuits, each master clock driver circuit having a plurality of delay elements, each master clock output signal being generated by a separate one of said master clock driver circuits; and one or more switching means in each master clock driver circuit, said switching means for allowing one or more delay elements to be switched into or switched out of said master clock driver circuit in order to increase or decrease the delay between said primary clock signal and said master clock output signal from said master clock driver circuit, said switching means including a random access memory (RAM).

9. A clock distribution system in a digital logic system, said clock distribution system producing one or more master clock output signals from a primary clock signal, said clock distribution system for allowing automatic adjustment of delay between said primary clock signal and each master clock output signal, said clock distribution system comprising:

one or more master clock driver circuits, each master clock driver circuit having a plurality of delay elements, each master clock output signal being generated by a separate one of said master clock driver circuits;

one or more switching means in each master clock driver circuit, said switching means for allowing one or more delay elements to be switched into or switched out of said master clock driver circuit in order to increase or decrease the delay between said primary clock signal and said master clock output signal from said master clock driver circuit; and a feedback path connected between the output of said master clock driver circuit and the input of said master clock driver circuit such that the feedback path generates a ring oscillator having a frequency inversely proportional to the delay between said primary clock signal and said master clock output signal.

10. A method for setting delays in a clock distribution circuit for use in a digital logic system, said digital logic system including a primary clock signal, a plurality of digital logic system components, said clock distribution circuit producing from said primary clock signal a plurality of master clock signals on a plurality of master clock output lines, one or more of said digital logic system components receiving a master clock signal on one of said master clock output lines, said method comprising the steps of:

for each master clock output line, generating a time delay between said primary clock signal and said master clock signal on said master clock output line by a series of delay elements;

dividing each of said series of delay elements into one or more subseries of delay elements, each said subseries of delay elements thereby generating a portion of said generated time delay;

coupling each of said subseries to a switching means, said switching means thereby controlling whether said subseries provides said portion of said generated time delay by blowing one or more fuses;

automatically controlling said time delay generated by said time delay generating means to ensure that differences among delays between said primary clock signal and said master clock signals on said master clock output lines are within a predetermined time range; and emulating a fuse in its blown state before said fuse is blown.

11. A method for setting delays in a clock distribution circuit for use in a digital logic system, said digital logic system including a primary clock signal, a plurality of digital logic system components, said clock distribution circuit producing from said primary clock signal a plurality of master clock signals on a plurality of master clock output lines, one or more of said digital logic system components receiving a master clock signal on one of said master clock output lines, said method comprising the steps of:

for each master clock output line, generating a time delay between said primary clock signal and said master clock signal on said master clock output line, said time delay generating step including the step of connecting a feedback loop across a time delay generating means, thereby generating an oscillating signal having a frequency inversely proportional to the generated time delay; and automatically controlling said time delay generated by said time delay generating means to ensure that differences among delays between said primary clock signal and said master clock signals on said master clock output lines are within a predetermined time range.

12. The method of claim 11, further comprising the step of measuring the frequency of said oscillating signal.

13. A method for automatically adjusting delay between a primary clock signal and each of one or more clock output signals in a clock distribution system in a digital logic system, said clock distribution system producing one or more master clock output signals from said primary clock signal, said clock distribution circuit comprising one or more master clock driver circuits, each master clock driver circuit having a plurality of delay elements, each master clock output signal being generated by a separate one of said master clock driver circuits, said method comprising the steps of:

setting one or more switching means in each master clock driver circuit, said switching means for allowing one or more delay elements to be switched into or switched out of said master clock driver circuit in order to increase or decrease the delay between said primary clock signal and said master clock output signal from said master clock driver circuit; and connecting a feedback path between the output of said master clock driver circuit and the input of said master clock driver circuit such that the feedback path generates a ring oscillator having a frequency inversely proportional to the delay between said primary clock signal and said master clock output signal.

14. A clock distribution circuit for use in a digital logic system, said digital logic system including a primary clock signal and a plurality of digital logic system components, said clock distribution circuit producing from said primary clock signal a plurality of master clock signals on a plurality of master clock output lines, one or more of said digital logic system components receiving a master clock signal on one of said master clock output lines, said clock distribution circuit comprising:

for each master clock output line, means for generating a time delay between said primary clock signal and said master clock signal on said master clock output line;

means for automatically controlling said time delay generated by said time delay generating means for ensuring that differences among delays between said primary clock signal and said master clock signals on said master clock output lines are within a predetermined time range;

means for measuring the difference between a target time delay and said time delay generated by said time delay generating means; and means for adjusting said time delay generating means by using said measured differences in a look-up table to determine an adjustment to bring said time delay generated by said time delay generating means closer to said target time delay.

15. A method for setting delays in a clock distribution circuit for use in a digital logic system, said digital logic system including a primary clock signal, a plurality of digital logic system components, said clock distribution circuit producing from said primary clock signal a plurality of master clock signals on a plurality of master clock output lines, one or more of said digital logic system components receiving a master clock signal on one of said master clock output lines, said method comprising the steps of:

for each master clock output line, generating a time delay between said primary clock signal and said master clock signal on said master clock output line;

automatically controlling said time delay generated by said time delay generating means to ensure that differences among delays between said primary clock signal and said master clock signals on said master clock output lines are within a predetermined time range;

measuring the difference between a target time delay and said generated time delay; and adjusting said generated time delay by using said measured difference in a look-up table to determine an adjustment to bring said generated time delay closer to said target time delay.

* * * * *

UNITED STATES PATENT AND TRADEMARK OFFICE
CERTIFICATE OF CORRECTION

PATENT NO. : 5,204,559

DATED : April 20, 1993

INVENTOR(S) : Ira Deyhimy, Robert N. Deming, William C. Terrell
and David W. Hedges It is certified that error appears in the above-identified patent and that said Letters Patent is hereby corrected as shown below:

Column 15, line 8, after 6.5 cancel "nns" and insert "ns."
line 12, after 6.5 cancel "nns" and insert "ns."

Signed and Sealed this

Fourth Day of January, 1994

Attest:

BRUCE LEHMAN

Attesting Officer                Commissioner of Patents and Trademarks